United States Patent
Yagishita

(10) Patent No.: US 10,274,585 B2
(45) Date of Patent: Apr. 30, 2019

(54) ELECTRONIC CIRCUIT, RADAR APPARATUS, AND METHOD OF CORRECTING RADAR TRANSMISSION CHANNELS

(71) Applicant: FUJITSU LIMITED, Kawasaki-shi, Kanagawa (JP)

(72) Inventor: Yohei Yagishita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 254 days.

(21) Appl. No.: 15/471,036

(22) Filed: Mar. 28, 2017

(65) Prior Publication Data
US 2017/0285143 A1 Oct. 5, 2017

(30) Foreign Application Priority Data
Apr. 1, 2016 (JP) .................... 2016-074546

(51) Int. Cl.
*G01S 7/40* (2006.01)
*G01S 13/42* (2006.01)
(Continued)

(52) U.S. Cl.
CPC .......... *G01S 7/4008* (2013.01); *G01S 7/4026* (2013.01); *G01S 13/42* (2013.01); *H03D 7/1441* (2013.01);
(Continued)

(58) Field of Classification Search
CPC ...... G01S 7/4008; G01S 13/42; G01S 7/4026; G01S 2013/0245; G01S 2007/4013; H03D 7/1441; H03D 7/165
(Continued)

(56) References Cited

U.S. PATENT DOCUMENTS 3,413,632 A * 11/1968 Christianson ........... G01S 13/28
342/102
4,060,806 A * 11/1977 Davies ...................... G01S 1/02
342/157
(Continued)

FOREIGN PATENT DOCUMENTS

JP    05-281336    10/1993
JP    2013-106118    5/2013
(Continued)

*Primary Examiner* — Bernarr E Gregory
(74) *Attorney, Agent, or Firm* — Fujitsu Patent Center

(57) ABSTRACT

An electronic circuit includes adjustment units configured to receive a same oscillating signal having a predetermined frequency and to adjust a phase and an amplitude of the oscillating signal to produce output oscillating signals, coupling points configured to supply the output oscillating signals produced by the adjustment units to antennas, couplers provided in one-to-one correspondence with outputs of the adjustment units, equal-length lines sharing the same length and extending from the couplers, respectively, mixer circuits coupled to the equal-length lines, respectively, each of the mixer circuits being configured to receive a same reference oscillating signal having the predetermined frequency and a corresponding one of the output oscillating signals, and a control circuit configured to cause the adjustment units to adjust at least one of the phase and the amplitude in response to direct-current components in outputs of the mixer circuits.

6 Claims, 8 Drawing Sheets

(51) Int. Cl.
  *H03D 7/14* (2006.01)
  *H03D 7/16* (2006.01)
  *G01S 13/02* (2006.01)
  *G01S 13/00* (2006.01)

(52) U.S. Cl.
  CPC ...... *H03D 7/165* (2013.01); *G01S 2007/4013* (2013.01); *G01S 2013/0245* (2013.01)

(58) Field of Classification Search
  USPC .................................................. 342/165–174
  See application file for complete search history.

(56) References Cited

U.S. PATENT DOCUMENTS

| | | | | |
|---|---|---|---|---|
| 4,315,262 A * | 2/1982 | Acampora | ........... | H04B 7/2041 342/352 |
| 4,520,361 A * | 5/1985 | Frazita | ................... | H01Q 3/267 342/372 |
| 4,538,150 A * | 8/1985 | Bone, Jr. | ............... | G01S 7/4021 342/123 |
| 4,642,642 A * | 2/1987 | Uurtamo | ............. | G01S 13/4436 342/174 |
| 5,008,844 A * | 4/1991 | Kyriakos | ............. | G01S 7/4004 342/174 |
| 5,038,146 A * | 8/1991 | Troychak et al. | ..... | H01Q 3/267 342/173 |
| 5,105,195 A * | 4/1992 | Conrad | ................. | G01S 7/4021 342/174 |
| 5,111,208 A * | 5/1992 | Lopez | ................... | H01Q 3/267 342/174 |
| 5,179,386 A * | 1/1993 | Rudish | .................. | G01S 13/426 342/371 |
| 5,315,304 A * | 5/1994 | Ghaleb | ................ | G01S 7/4004 342/151 |
| 5,325,101 A * | 6/1994 | Rudish | ..................... | H01Q 3/22 342/372 |
| 5,410,320 A * | 4/1995 | Rudish | ..................... | H01Q 3/22 342/368 |
| 5,412,414 A * | 5/1995 | Ast | ........................ | H01Q 3/267 342/174 |
| 5,430,453 A * | 7/1995 | Rudish | .................. | G01S 13/426 342/373 |
| 6,100,841 A * | 8/2000 | Toth | ...................... | G01S 7/4021 342/149 |
| 6,157,343 A * | 12/2000 | Andersson | ............ | H01Q 3/267 342/174 |
| 6,549,164 B2 * | 4/2003 | Paschen | ................ | H01Q 3/267 342/371 |
| 2003/0142012 A1 * | 7/2003 | Hirabe | .................... | H01Q 3/267 342/173 |
| 2005/0219118 A1 * | 10/2005 | Kubo | .................... | H01Q 3/267 342/174 |
| 2013/0057447 A1 | 3/2013 | Pivit et al. | | |

FOREIGN PATENT DOCUMENTS

| | | |
|---|---|---|
| JP | 2013-522993 | 6/2013 |
| WO | 2011/113526 | 9/2011 |

* cited by examiner

US 10,274,585 B2

ELECTRONIC CIRCUIT, RADAR APPARATUS, AND METHOD OF CORRECTING RADAR TRANSMISSION CHANNELS

CROSS-REFERENCE TO RELATED APPLICATIONS

The present application is based upon and claims the benefit of priority from the prior Japanese Patent Application No. 2016-074546 filed on Apr. 1, 2016, with the Japanese Patent Office, the entire contents of which are incorporated herein by reference.

FIELD

The disclosures herein relate to an electronic circuit, a radar apparatus, and a method of correcting radar transmission channels.

BACKGROUND

The phased array radar utilizes a phased array antenna made by arranging a plurality of antennas corresponding to a plurality of channels. In the phased array antenna, giving phase differences to a plurality of transmission signals for transmission from the plurality of antennas makes it possible to emit radio waves in a desired direction. Further, giving phase differences to a plurality of received signals enables the realization of a reception antenna having directivity in a desired direction.

Emitting radio waves in a desired direction requires accurate control of the phase and amplitude of transmission signals in the respective channels. In order to achieve accurate control of phase and amplitude, the phase value settings and amplitude value settings of these channels may be adjusted in order to perform channel correction (i.e., zero-point correction) in advance, such that phase differences and amplitude differences between the channels are precisely equal to zero.

In the related art, zero-point correction is performed by utilizing a mixer to detect a phase difference and a diode to detect an output power difference between two adjacent channels. An attempt to take measurements and make adjustments simultaneously in a parallel manner with respect to all the channels, however, gives rise to a problem in that the identity of a signal serving as a reference for phase and amplitude correction becomes obscure. In such simultaneous, parallel measurement, signals leaking through couplers that connect the channels to the mixer or connect the channels to the diode may cause significant interference between the channels, which results in the difficulty of making a correction having a basis on accurate references. Rather than in a simultaneous, parallel manner, two adjacent channels may be successively selected for comparison with each other in a consecutive manner. Such an arrangement, however, may create a problem in that the correction of a large number of channels becomes time consuming.

RELATED-ART DOCUMENTS

Patent Document

[Patent Document 1] Japanese Laid-Open Patent Publication No. 5-281336
[Patent Document 2] Japanese National Publication of International Patent Application No. 2013-522993
[Patent Document 3] Japanese Laid-open Patent Publication No. 2013-106118

SUMMARY

According to an aspect of the embodiment, an electronic circuit includes a plurality of adjustment units configured to receive a same oscillating signal having a predetermined frequency and to adjust a phase and an amplitude of the oscillating signal to produce output oscillating signals, a plurality of coupling points configured to supply the output oscillating signals produced by the plurality of adjustment units to a plurality of antennas, a plurality of couplers provided in one-to-one correspondence with outputs of the plurality of adjustment units, a plurality of equal-length lines sharing the same length and extending from the plurality of couplers, respectively, a plurality of mixer circuits coupled to the plurality of equal-length lines, respectively, each of the plurality of mixer circuits being configured to receive a same reference oscillating signal having the predetermined frequency and a corresponding one of the output oscillating signals, and a control circuit configured to cause the plurality of adjustment units to adjust at least one of the phase and the amplitude in response to direct-current components in outputs of the plurality of mixer circuits.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
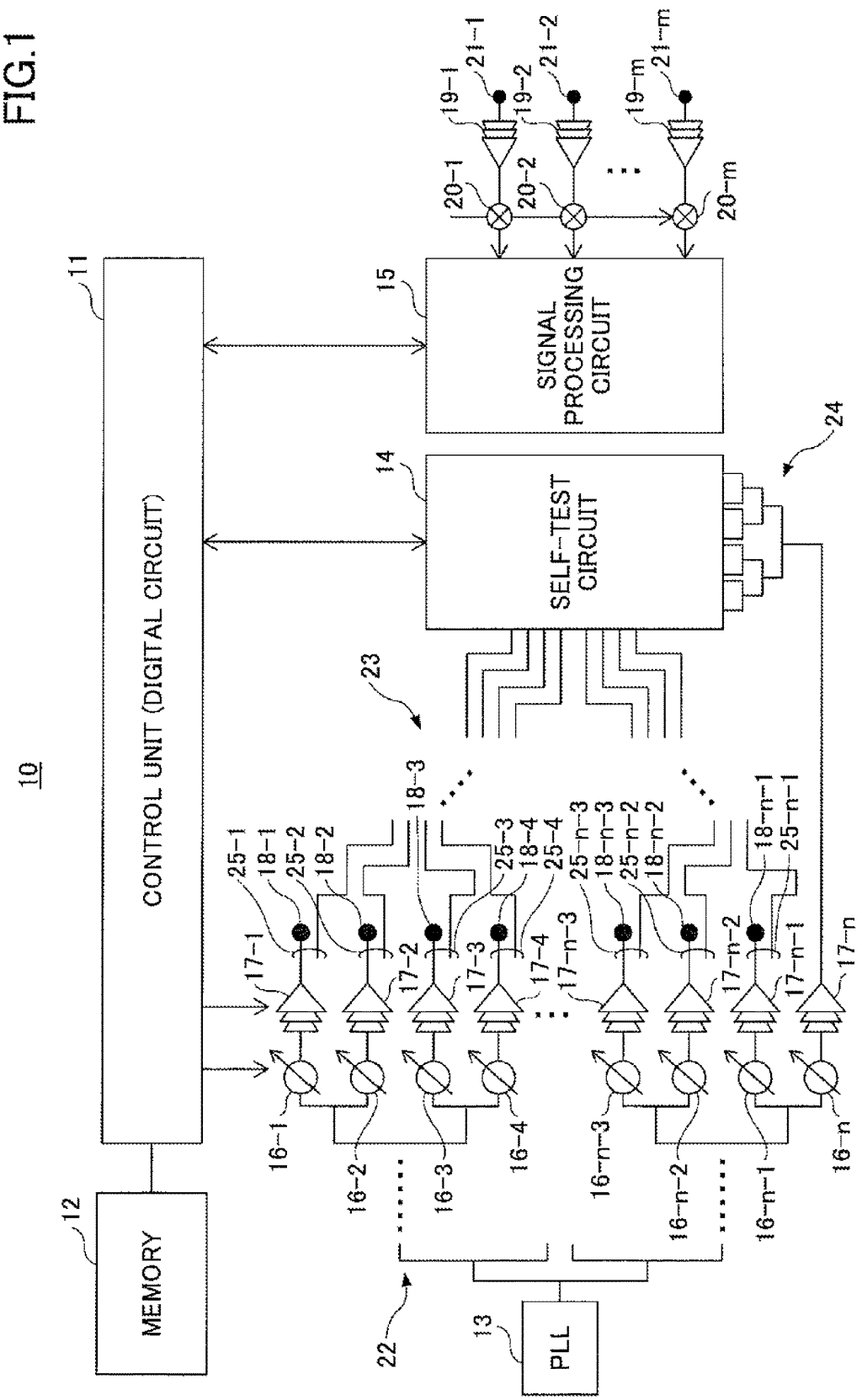
FIG. 1 is a drawing illustrating an example of the configuration of a phased array radar apparatus.

FIG. 1 is a drawing illustrating an example of the configuration of a phased array radar apparatus. In FIG. 1 and the subsequent drawings, boundaries between functional or circuit blocks illustrated as symbols or boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

A phased array radar apparatus 10 illustrated in FIG. 1 includes a control unit 11, a memory 12, a PLL (phase locked loop) circuit 13, a self-test circuit 14, and a signal processing circuit 15. The phased array radar apparatus 10 further includes n (n: integer greater than or equal to 3) phase shifters 16-1 through 16-$n$, n amplifiers 17-1 through 17-$n$, m (m: integer greater than or equal to 2) amplifiers 19-1 through 19-$m$, and m mixer circuits 20-1 through 20-$m$. The phased array radar apparatus 10 further includes a plurality of branch lines 22 sharing the same length, a plurality of equal-length lines 23 sharing the same length, and a plurality of branch lines 24 sharing the same length. The provision of lines sharing the same length allows a phase change and an amplitude change in an oscillating signal propagating through the lines to be set equal to each other between the lines. Especially in the case of high-frequency signals, a substantial phase change occurs even with a short distance. It is thus preferable to use lines sharing the same length for propagation with respect to a plurality of oscillating signals that are required to have the same phase.

The PLL circuit 13 generates an oscillating signal having a predetermined frequency. The phase shifters 16-1 through 16-$n$ each receive the oscillating signal generated by the PLL circuit 13. The outputs of the phase shifters 16-1 through 16-$n$ are applied to the amplifiers 17-1 through 17-$n$, respectively. The phase shifters 16-1 through 16-$n$ and the amplifiers 17-1 through 17-$n$ enable the adjustment of phase and amplitude of the oscillating signal, respectively. The phase shifters 16-1 through 16-$n$ may be configured to adjust amplitude in addition to phase. In such a case, there is no need to provide the amplifiers 17-1 through 17-$n$, and the phase shifters 16-1 through 16-$n$ each serve as a phase and amplitude adjustment unit to adjust both phase and amplitude. Further, the order in which the phase shifters 16-1 through 16-$n$ and the amplifiers 17-1 through 17-$n$ are arranged may be reversed. The phase shifters 16-1 through 16-$n$ and the amplifiers 17-1 through 17-$n$ may be collectively regarded as n adjustment units each of which is capable of adjusting both phase and amplitude.

The phased array radar apparatus 10 further includes a plurality of coupling points 18-1 through 18-$n$-1 for the purpose of supplying the output oscillating signals produced by the amplifiers 17-1 through 17-$n$ to the plurality of transmission antennas. The phased array radar apparatus 10 further includes a plurality of couplers 25-1 through 25-$n$-1 provided in one-to-one correspondence with the outputs of the amplifiers 17-1 through 17-$n$-1. The equal-length lines 23 are defined as lines extending from the couplers 25-1 through 25-$n$-1 and sharing the same length. The phased array radar apparatus 10 further includes a plurality of coupling points 21-1 through 21-$m$ for the purpose of coupling the inputs of the amplifiers 19-1 through 19-$m$ to the plurality of reception antennas.

The signals that are closest to the oscillating signals transmitted from the antennas in terms of phase and amplitude conditions are the signals appearing in the proximity of the coupling points 18-1 through 18-$n$-1. Accordingly, the position of the couplers 25-1 through 25-$n$-1 is preferably close to the position of the coupling points 18-1 through 18-$n$-1 in order to perform zero-point correction based on the signals closest in condition to the actually transmitted oscillating signals.

The phase shifters 16-1 through 16-$n$, the amplifiers 17-1 through 17-$n$, and the coupling points 18-1 through 18-$n$-1 serve as the plurality of transmission channels for transmitting the transmission signals of a phased array antenna. The coupling points 21-1 through 21-$m$, the amplifiers 19-1 through 19-$m$, and the mixer circuits 20-1 through 20-$m$ serve as a plurality of reception channels for receiving the reception signals of a phased array antenna. Transmission signals whose phase and amplitude are adjusted by the control unit are supplied from the plurality of transmission channels to the array antenna, thereby emitting radio waves in a desired direction. A plurality of reception signals propagating through the plurality of reception channels are applied to the signal processing circuit 15. The signal processing circuit 15 operates under the control of the control unit 11 to perform AD conversion, signal summation, wave detection, envelope detection, etc.

The self-test circuit 14 receives the plurality of output oscillating signals supplied from the amplifiers 17-1 through 17-$n$-1 through the couplers 25-1 through 25-$n$-1 and the equal-length lines 23, and also receives a reference oscillating signal supplied from the amplifier 17-$n$ through the branch lines 24. This reference oscillating signal has the same frequency as the plurality of output oscillating signals.

The self-test circuit 14 includes a plurality of mixer circuits each of which receives the same reference oscillating signal and a corresponding one of the plurality of output oscillating signals. The mixer circuits are coupled to one end of the plurality of equal-length lines 23, respectively. Here, the term "same reference oscillating signal" means that the reference oscillating signals applied to the mixer circuits are the same as each other (i.e., the signals are supplied from the same signal source through the equal-length branch lines 24). The self-test circuit supplies data responsive to the direct-current components of the outputs of the mixer circuits to the control unit 11. Based on the data responsive to the direct-current components of the outputs of the mixer circuits, the control unit 11 utilizes the phase shifters 16-1 through 16-$n$ and the amplifiers 17-1 through 17-$n$ to adjust at least one of the phase and amplitude of the output oscillating signals. In so doing, the control unit 11 may perform such adjustment operations based on the programs stored in the memory 12. Further, the control unit 11 may store in the memory 12 the data responsive to the direct-current components of the outputs of the mixer circuits received from the self-test circuit 14 to perform the adjustment operations based on the data stored in the memory 12. The configuration of the self-test circuit 14 and the phase and amplitude adjustment operations by the control unit 11 will be described later in detail.

With the above-noted adjustment operations, the control unit 11 performs zero-point correction with respect to the plurality of transmission channels of the phased array radar apparatus 10 in a simultaneous, parallel manner. This correction uses only one and the same reference oscillating signal as reference signals applied to the plurality of mixer circuits, so that the reference for correction is clearly established between the plurality of channels. Further, the adjustment operations performed in a simultaneous, parallel manner enables the realization of high-speed correction.

Figure 2:
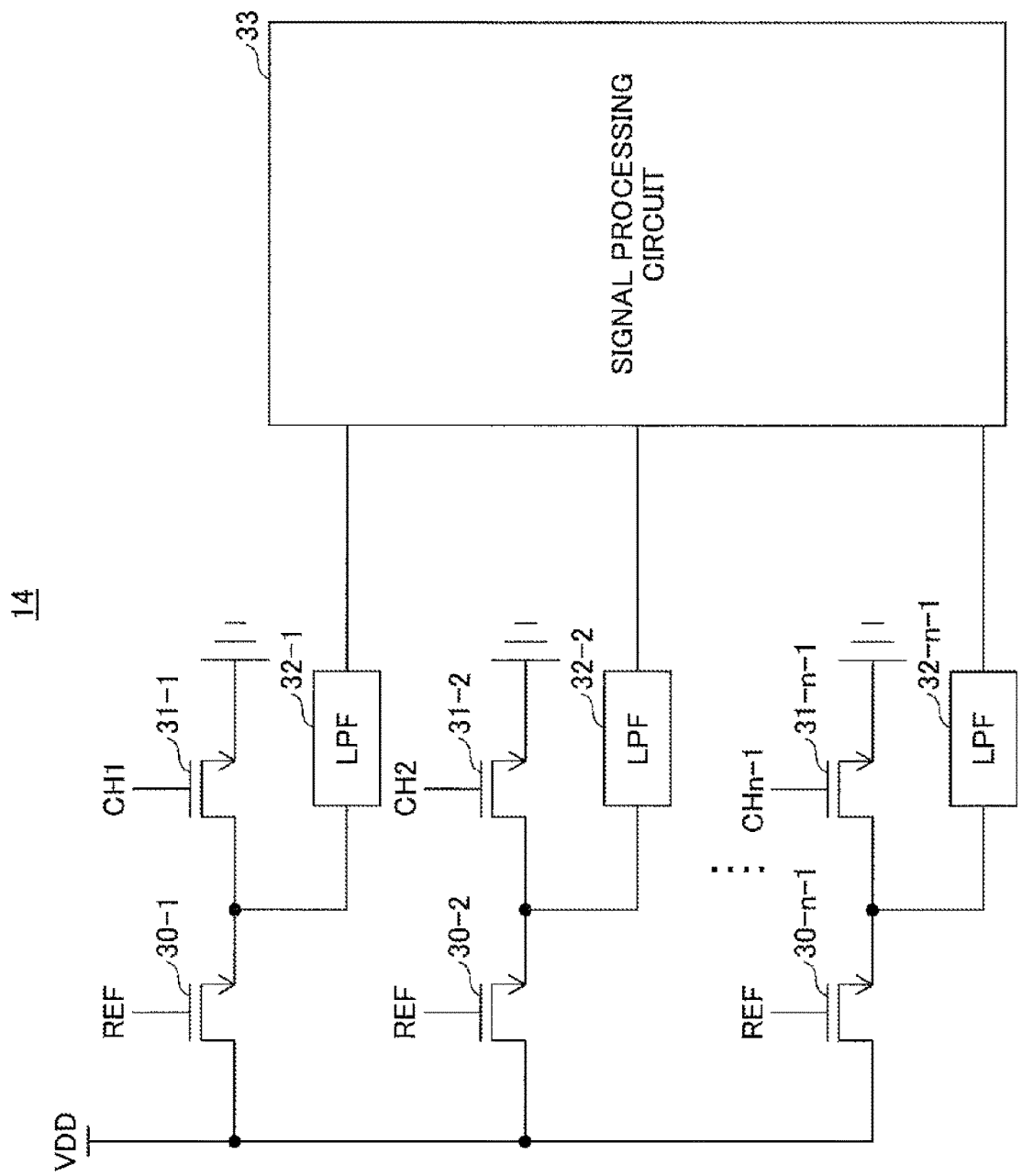
FIG. 2 is a drawing illustrating an example of the configuration of a self-test circuit.

FIG. 2 is a drawing illustrating an example of the configuration of the self-test circuit 14. The self-test circuit 14 illustrated in FIG. 2 includes n−1 NMOS transistors 30-1 through 30-n−1, n−1 NMOS transistors 31-1 through 31-n−1, n−1 low-pass filters 32-1 through 32-n−1, and a signal processing circuit 33.

The NMOS transistors 30-1 through 30-n−1 and the NMOS transistors 31-1 through 31-n−1 serve as the mixer circuits. The NMOS transistor 30-i and the NMOS transistor 31-i of the i-th mixer circuit are series-connected between a power supply voltage VDD and the ground voltage. The gate nodes of these two NMOS transistors receive a reference oscillating signal REF and a corresponding one of a plurality of output oscillating signals CH1 through CHn−1, respectively. The plurality of output oscillating signals CH1 through CHn−1, which are supplied through the equal-length lines 23 illustrated in FIG. 1, belong to the plurality of transmission channels, respectively. The output of the mixer circuit is a voltage appearing at the connection point between the two NMOS transistors.

The outputs of the mixer circuits each of which is a voltage at the connection point between the two NMOS transistors are coupled to the low-pass filters 32-1 through 32-n−1, respectively. The low-pass filters 32-1 through 32-n−1 remove high-frequency components, thereby removing the signal component of a sum frequency among the signal component of a sum frequency and the signal component of a difference frequency contained in the output of each mixer circuit as derived from the two frequencies of mixer input signals. Since the two oscillating signals applied to the mixer circuit in each channel share the same frequency, the signal component remaining after the removal of high-frequency components by low-pass filtering is a direct-current component. The magnitudes of the n−1 direct-current components, which are obtained with respect to the n−1 channels, respectively, reflect the phase differences between the reference oscillating signal REF and the output oscillating signals CH1 through CHn−1 as well as the amplitudes of the output oscillating signals CH1 through CHn−1. The signal processing circuit 33 performs AD conversion with respect to the direct-current component signals to generate digital data, followed by supplying the digital data to the control unit 11 (see FIG. 1).

It suffices for a mixer circuit to have the function to mix two oscillating signals applied thereto and to generate a direct-current component responsive to the phase difference and amplitudes of these two oscillating signals. A typical example of signal processing that realizes such a mixer circuit function is multiplication. It suffices for a mixer circuit to perform an approximation to multiplication rather than precise multiplication.

Figure 3:
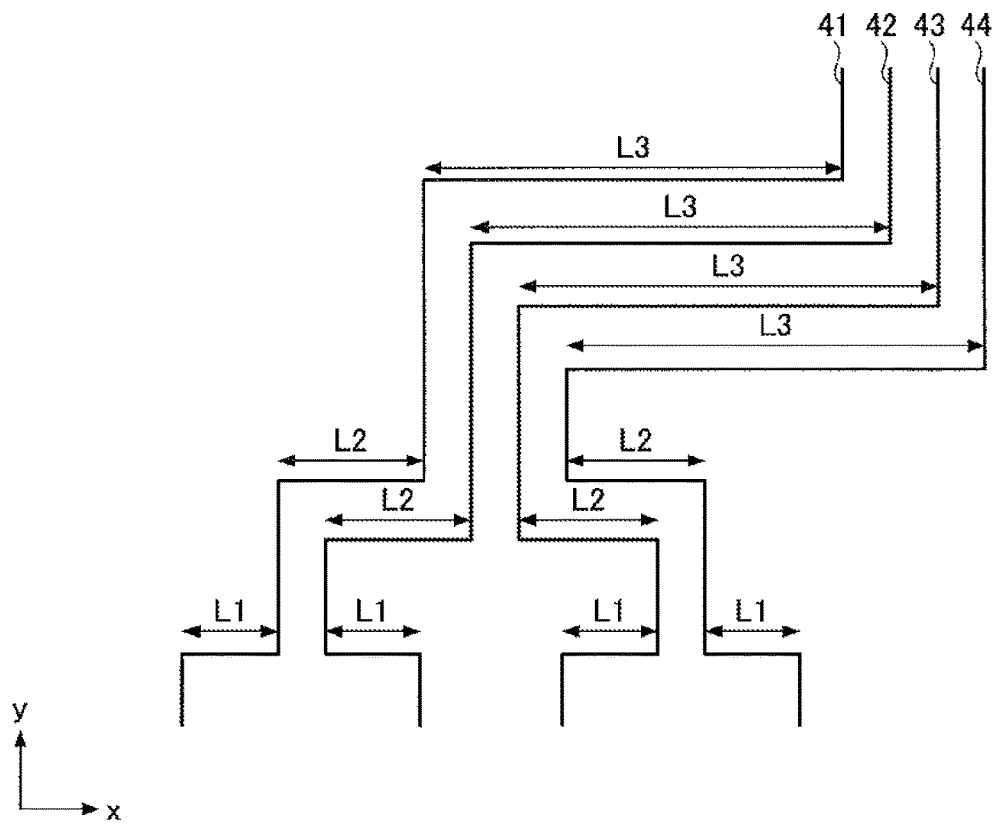
FIG. 3 is a drawing illustrating an example of the configuration of equal-length lines.

FIG. 3 is a drawing illustrating an example of the configuration of equal-length lines. A plurality of lines 41 through 44 illustrated in FIG. 3 are equal-length lines sharing the same length. An x direction and a y direction illustrated by respective arrows are orthogonal to teach other. The lines 41 through 44 are constituted by a combination of line segments extending in the x direction and line segments extending in the y direction.

In the y direction, the lines 41 through have the same length as each other. Namely, as for the line segments extending in the y direction, the lengths of the lines 41 through 44 are the same as each other. As the line segments extending in the x direction, each of the lines 41 through 44 includes line segments L1 through L3. The four line segments L1 of the lines 41 through 44 share the same length, the four line segments L2 of the lines 41 through 44 sharing the same length, and the four line segments L3 of the lines 41 through 44 sharing the same length. Namely, as for the line segments extending in the x direction, the lengths of the lines 41 through 44 are the same as each other.

In the case of a plurality of lines being given, each line is divided into line segments extending in the x direction and line segments extending in the y direction, and the lines are laid out such that the lines are constituted by the line segments sharing the same length in each of these two directions, thereby enabling the provision of equal-length lines.

Figure 4:
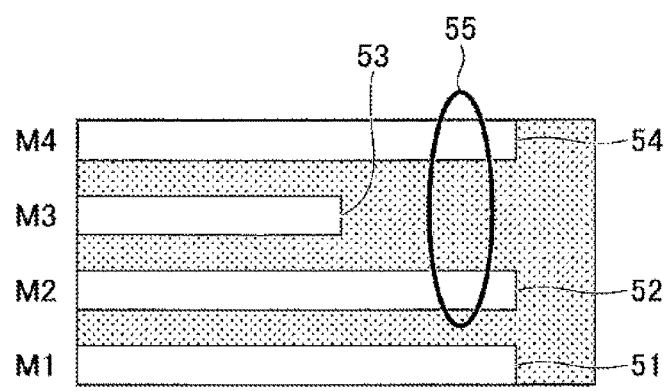
FIG. 4 is a drawing illustrating an example of the configuration of a coupler.

FIG. 4 is a drawing illustrating an example of the configuration of a coupler. It is not preferable that the equal-length lines 23 for supplying the output oscillating signals to the signal processing circuit 15 provided for the purpose of transmission channel correction influence the signals transmitted through the transmission channels to the antenna during routine radar operations. In consideration of this, one ends of the equal-length lines 23 extending in parallel to the signal lines of transmission channels are situated in the close proximity of these signal lines, such that the signal lines and the equal-length lines 23 are connected through capacitive coupling or electromagnetic coupling. FIG. 4 is a drawing illustrating an example of the implementation of such coupling.

FIG. 4 illustrates part of the interconnection layers of an integrated circuit chip on which the phased array radar apparatus 10 is implemented. In this example, four metal interconnection layers M1 through M4 have interconnection lines 51 through 54 formed therein, respectively. The interconnection line 53 is set to the ground potential, for example. The interconnection line 54, which is provided as a transmission channel, is a line portion situated on the output side of one of the amplifiers 19-1 through 19-m illustrated in FIG. 1. The interconnection line 52 is one of the equal-length lines 23 illustrated in FIG. 1.

As illustrated in FIG. 4, the interconnection line 54 connected to the output of an amplifier and the interconnection line 52 serving as one of the equal-length lines are disposed to extend in parallel to each other, and, thus, are coupled to each other through capacitive coupling or electromagnetic coupling around a position 55. Such a capacitive coupling or electromagnetic coupling allows a coupler to be formed between the transmission channel and the equal-length line.

Figure 5:
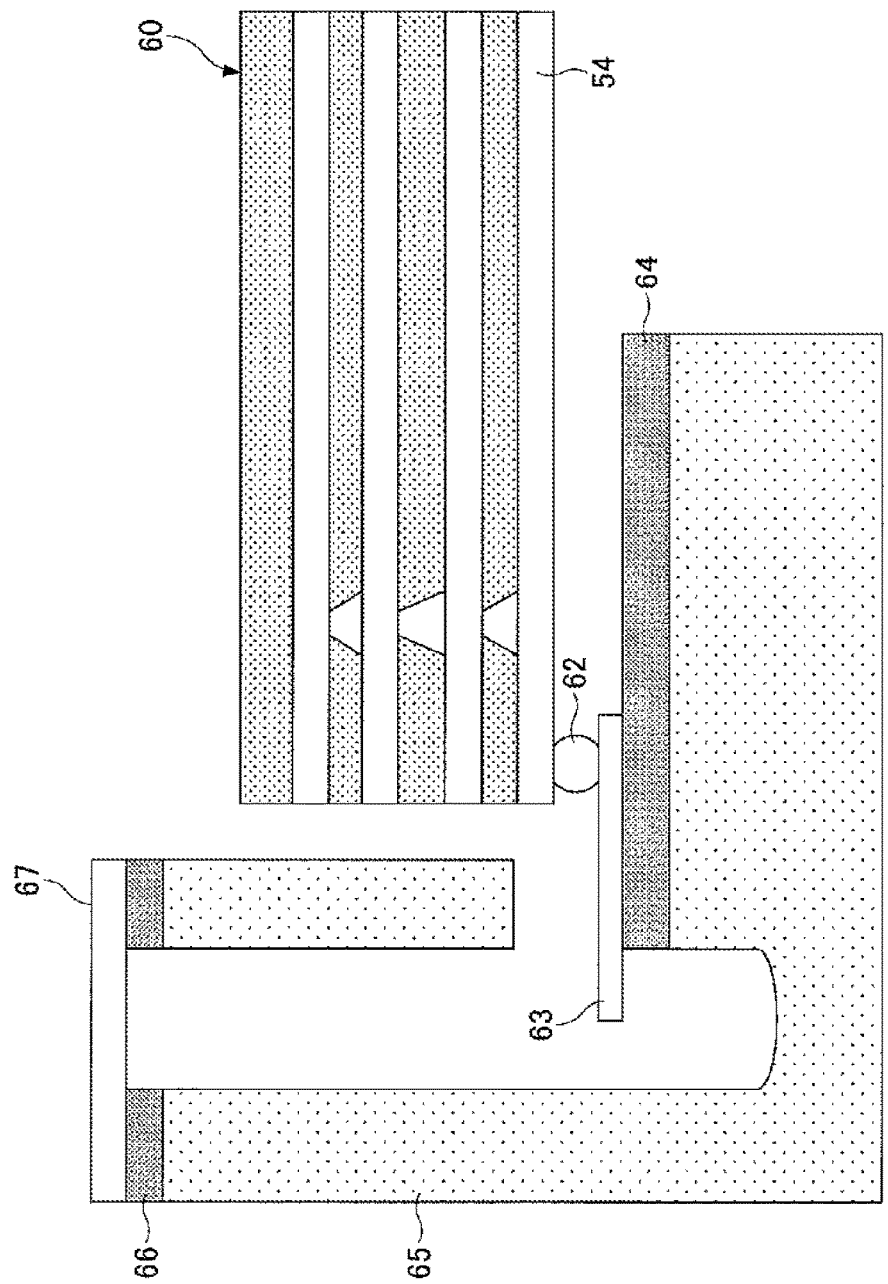
FIG. 5 is a drawing illustrating an example of the configuration serving to couple an antenna to an integrated circuit chip of the phased array radar apparatus.

FIG. 5 is a drawing illustrating an example of the configuration serving to couple an antenna to the integrated circuit chip of the phased array radar apparatus 10. The configuration illustrated in FIG. 5 includes an integrated circuit chip 60, a solder ball 62, a dielectric substrate 64, a probe 63, a waveguide 65, a dielectric substrate 66, and a patch antenna 67. The dielectric substrates 64 and 66 may be made of alumina, for example. The probe 63, the waveguide 65, and the patch antenna 67 may be made of metal.

The interconnection line 54 of the integrated circuit chip 60 on which the phased array radar apparatus 10 is implemented is coupled through the solder ball 62 to the probe 63 formed on the dielectric substrate 64, with the interconnection-layer side (i.e., circuit-face side) of the integrated circuit chip 60 facing downward in the flip-chip position. The part of the interconnection line 54 in contact with the solder ball 62 serves as one of the coupling points 18-1 through 18-$n$-1 illustrated in FIG. 1. A coupling between the integrated circuit chip 60 and the probe 63 may alternatively be made by use of wire bonding, with the circuit face of the integrated circuit chip 60 facing upward, rather than through the solder ball 62, with the flip-chip configuration.

The probe 63 projects into the inside space of the waveguide 65. The output oscillating signal of a transmission channel of the integrated circuit chip 60 is transmitted to the patch antenna through the probe 63 and the waveguide 65. One set of the probe 63, the waveguide 65, and the patch antenna 67 is provided for each one of the plurality of transmission channels.

In the configuration providing a coupling with the antenna illustrated in FIG. 5, the connection point (i.e., the power-feed point) at which the integrated circuit chip 60 is coupled to the antenna is preferably disposed in the proximity of a perimeter edge of the integrated circuit chip 60. Namely, the coupling points 18-1 through 18-$n$-1 illustrated in FIG. 1 may be situated in the proximity of a perimeter edge of the integrated circuit chip 60 (i.e., in the proximity of one of the four perimeter sides of a rectangular chip). The equal-length lines 23, which are coupled to the coupling points 18-1 through 18-$n$-1 through the couplers 25-1 through 25-$n$-1, are disposed to extend toward the center of the integrated circuit chip 60 (i.e., to extend away from the perimeter edge).

Figure 6:
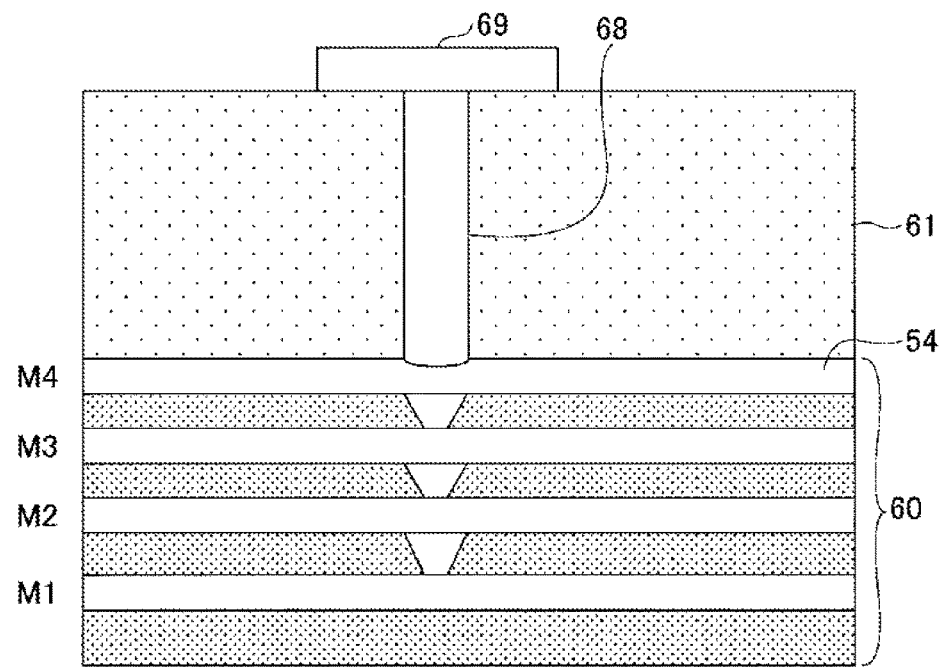
FIG. 6 is a drawing illustrating another example of the configuration serving to couple an antenna to the integrated circuit chip of the phased array radar apparatus.

FIG. 6 is a drawing illustrating another example of the configuration serving to couple an antenna to the integrated circuit chip of the phased array radar apparatus 10. The configuration illustrated in FIG. 5 includes the integrated circuit chip 60, a resin layer 61, an interconnection 68, and the patch antenna 69. The resin layer 61 and the interconnection 68 serve as a redistribution layer, through which the interconnection line 54 of the integrated circuit chip 60 is coupled to the patch antenna 69. The part of the interconnection line 54 in contact with the interconnection 68 serves as one of the coupling points 18-1 through 18-$n$-1 illustrated in FIG. 1. One set of the interconnection 68 and the patch antenna 69 is provided for each one of the plurality of transmission channels.

In the configuration providing a coupling with the antenna illustrated in FIG. 6, the connection point (i.e., the power-feed point) at which the integrated circuit chip 60 is coupled to the antenna may be disposed at any point, which may be in the proximity of a perimeter edge of the integrated circuit chip 60 or in the proximity of the center of the integrated circuit chip 60. Namely, the configuration utilizing a redistribution layer as illustrated in FIG. 6 allows sufficient latitude to be given to the position of the coupling points 18-1 through 18-$n$-1 illustrated in FIG. 1.

Figure 7:
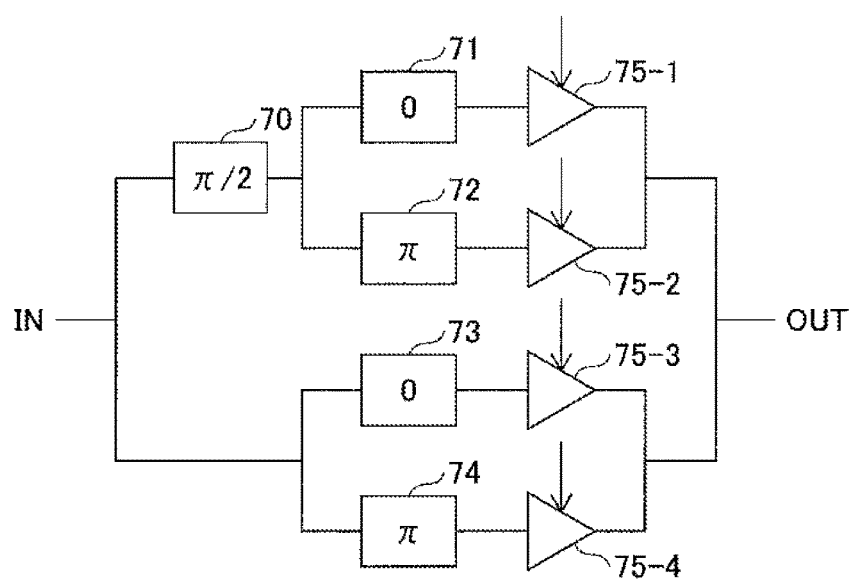
FIG. 7 is a drawing illustrating an example of the configuration of a phase shifter.

FIG. 7 is a drawing illustrating an example of the configuration of a phase shifter. Each of the phase shifters 16-1 through 16-$n$ illustrated in FIG. 1 may have the same configuration as that illustrated in FIG. 7. The phase shifter illustrated in FIG. 7 includes delay units 70 through 74 and amplifiers 75-1 through 75-4.

The delay units 70 through 74 are circuit elements imposing a phase delay of $\pi/2$, 0, $\pi$, 0, and $\pi$, respectively, and may be implemented by use of transmission lines having such lengths as to impose these phase delays. The amplifier 75-1 amplifies a signal made by delaying an input signal IN by $\pi/2$ with a variable amplification factor. The amplifier 75-2 amplifies a signal made by delaying the input signal IN by $3\pi/2$ with a variable amplification factor. The amplifier 75-3 amplifies a signal made by delaying the input signal IN by 0 with a variable amplification factor. The amplifier 75-4 amplifies a signal made by delaying the input signal IN by $\pi$ with a variable amplification factor. The output signals of the amplifiers 75-1 through 75-4 are added together to produce a sum serving as an output signal OUT. The amplification factors of the amplifiers 75-1 through 75-4 are adjusted to produce an oscillating signal having a desired phase value (i.e., desired phase shift).

Figure 8:
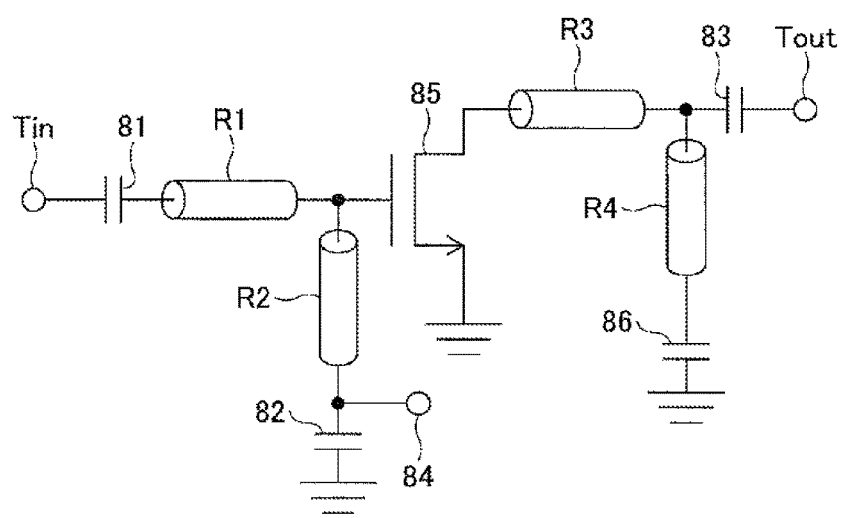
FIG. 8 is a drawing illustrating an example of the configuration of an amplifier illustrated in FIG. 7.

FIG. 8 is a drawing illustrating an example of the configuration of an amplifier illustrated in FIG. 7. Each of the amplifiers 75-1 through 75-4 illustrated in FIG. 7 may have the same configuration as that illustrated in FIG. 8. The amplifier illustrated in FIG. 8 includes capacitors 81 through 83, an NMOS transistor 85, a power supply 86, and transmission lines R1 through R4. An input oscillating signal (one of the output signals of the delay units 71 through 74 illustrated in FIG. 7) is applied to an input terminal Tin. The voltage of the gate node of the NMOS transistor 85 then fluctuates in response to the input oscillating signal through a capacitive coupling provided by the capacitor 81. In response, a voltage signal made by amplifying the voltage of the input oscillating signal appears at the drain node of the NMOS transistor 85. This voltage signal is transmitted to an output terminal Tout through a capacitive coupling provided by the capacitor 83. As a result, the oscillating signal made by amplifying the amplitude voltage of the input oscillating signal applied to the input terminal Tin is transmitted from the output terminal Tout.

A control terminal 84 receives an analog voltage indicative of the amplification factor of the amplifier from the control unit 11 illustrated in FIG. 1. This applied voltage serves to charge the capacitor 82 such that the voltage across the capacitor 82 is set equal to this analog voltage. This analog voltage from the control unit 11 serves to determine the center of voltage changes at the gate node of the NMOS transistor 85. In response to the level of this center voltage, the amplitude of the voltage appearing at the drain node of the NMOS transistor 85 changes. Namely, adjusting the level of this analog voltage supplied from the control unit 11 allows the amplitude of the oscillating signal transmitted from the output terminal Tout to be controlled. The transmission lines R1 through R4 function as resistive components as appropriate.

Figure 9:
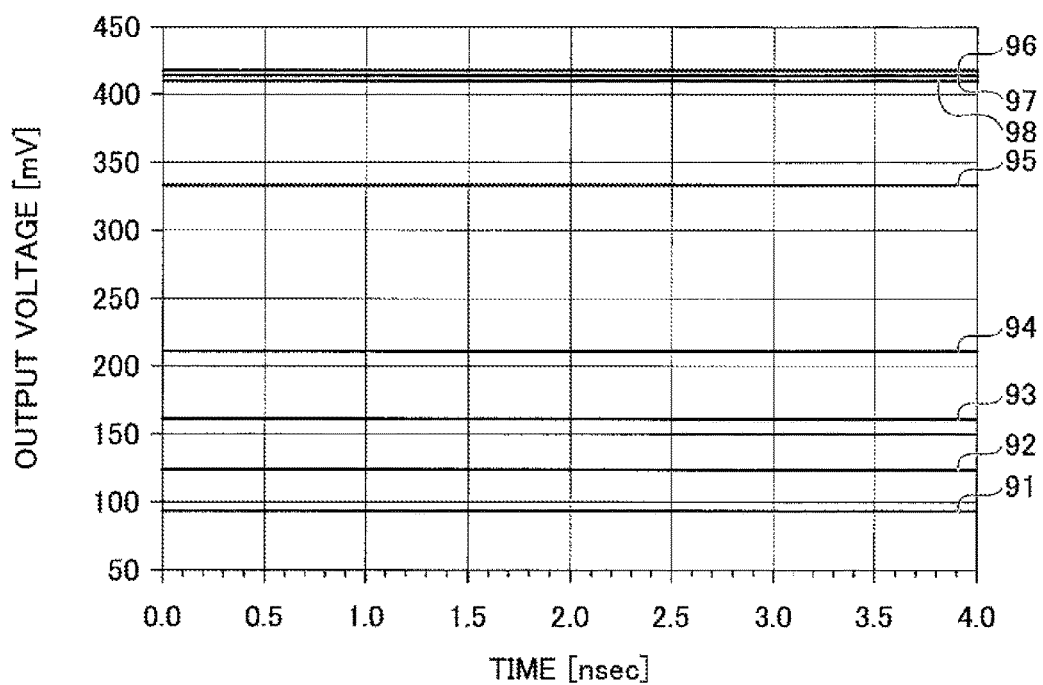
FIG. 9 is a drawing illustrating an example of the magnitude of a direct-current component in the output of a mixer circuit illustrated in FIG. 4.

FIG. 9 is a drawing illustrating an example of the magnitude of a direct-current component in the output of a mixer circuit illustrated in FIG. 4. FIG. 9 illustrates the results of circuit simulation conducted under the conditions that both the input oscillating signal (i.e., one of CH1 through CHn-1, which will hereinafter be referred to as CH) and the reference oscillating signal (REF) applied to the mixer circuit have an amplitude of 300 mV and an oscillating frequency of 80 GHz. In FIG. 9, the horizontal axis represents time, and the vertical axis represents the voltage value of a direct-current component in the output of the mixer circuit.

Voltage waveforms 91 through 98 depict the voltage of an output direct-current component in the case of the phase difference between the input oscillating signal CH and the reference oscillating signal REF of the mixer circuit being 0 degree, 30 degrees, 45 degrees, 60 degrees, 90 degrees, 120 degrees, 150 degrees, and 180 degrees, respectively. As an overall trend, the smaller the phase difference, the smaller the voltage of an output direct-current component of the mixer circuit is.

Figure 10:
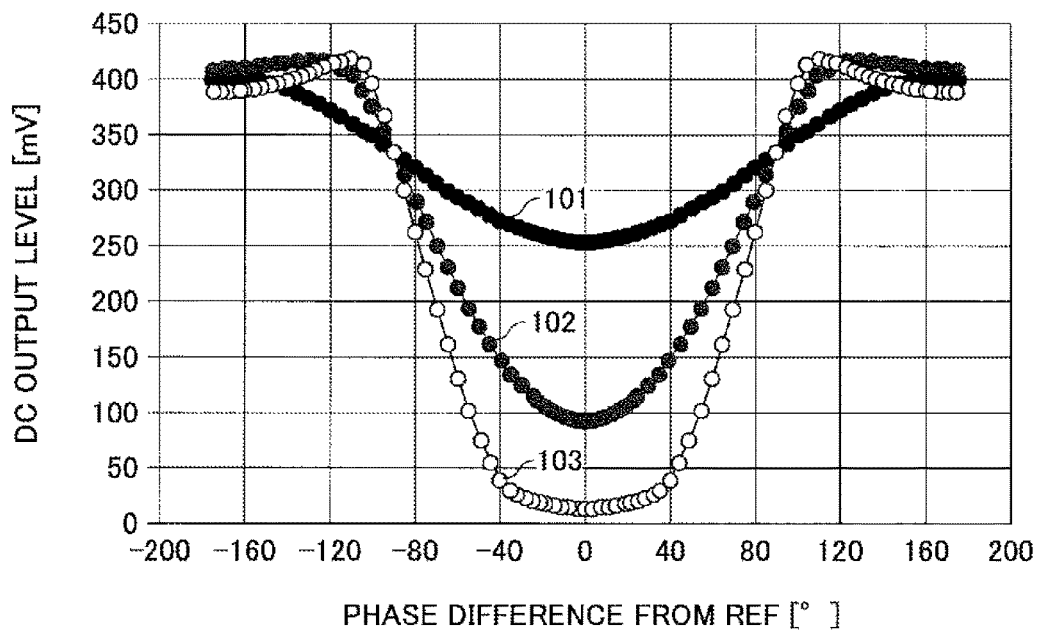
FIG. 10 is a drawing illustrating changes in the magnitude of a direct-current component in the output of a mixer circuit illustrated in FIG. 4 in response to changes in the phase difference.

FIG. 10 is a drawing illustrating changes in the magnitude of a direct-current component in the output of a mixer circuit illustrated in FIG. 4 in response to changes in the phase difference. FIG. 10 illustrates the results of circuit simulation conducted under the conditions that both the input oscillating signal CH and the reference oscillating signal REF applied to the mixer circuit have an oscillating frequency of 80 GHz and that the amplitude of the reference oscillating signal REF is 300 mV. In FIG. 10, the horizontal axis represents the relative phase difference between the two input signals applied to the mixer circuit, and the vertical axis represents the voltage value of a direct-current component in the output of the mixer circuit.

Voltage waveforms 101 through 103 depict the voltage of an output direct-current component in the case of the amplitude of the input oscillating signal CH of the mixer circuit being 100 mV, 300 mV, and 500 mV, respectively. As illustrated in FIG. 10, the voltage of an output direct-current component of the mixer circuit has a local minimum at the point at which the phase difference between the input oscillating signal CH and the reference oscillating signal REF is zero. Since the voltage of an output direct-current of the mixer circuit is at a minimum when the phase difference is zero, finding such a local minimum serves to achieve the state in which the phase difference is zero. As can be seen in FIG. 10, further, the minimum voltage value at the point of a zero phase difference decreases as the amplitude of the input oscillating signal CH increases.

Figure 11:
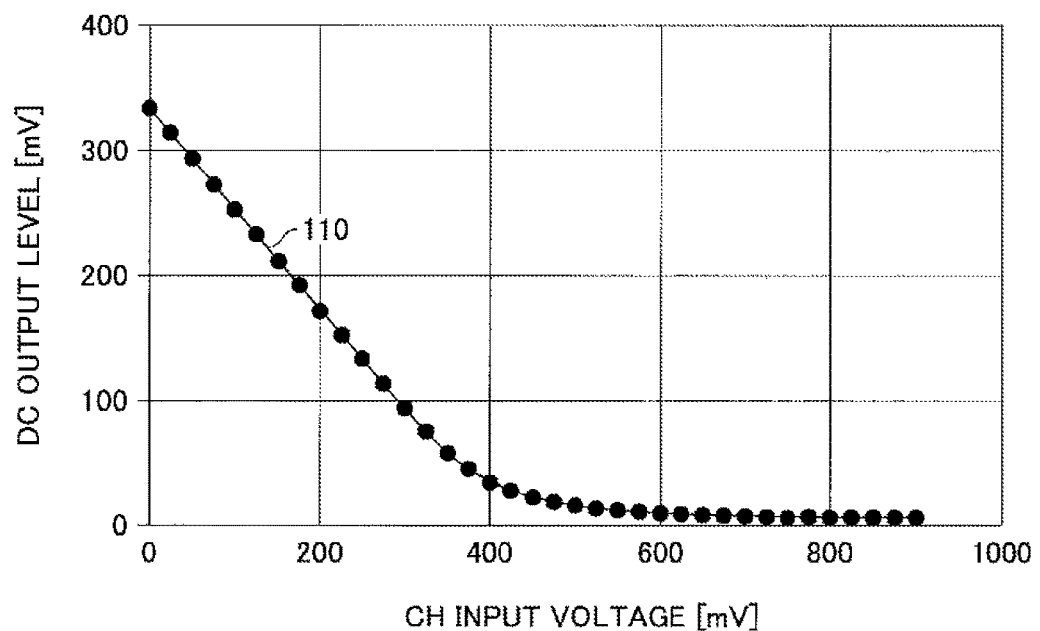
FIG. 11 is a drawing illustrating changes in the local minimum value of a direct-current component in the output of a mixer circuit illustrated in FIG. 4 in response to changes in the amplitude of the reference oscillating signal.

FIG. 11 is a drawing illustrating changes in the local minimum value of a direct-current component in the output of a mixer circuit illustrated in FIG. 4 in response to changes in the amplitude of the reference oscillating signal. FIG. 11 illustrates the results of circuit simulation conducted under the conditions that both the input oscillating signal CH and the reference oscillating signal REF applied to the mixer circuit have an oscillating frequency of 80 GHz and that the amplitude of the reference oscillating signal REF is 300 mV. In FIG. 11, the horizontal axis represents the amplitude voltage of the input oscillating signal CH applied to the mixer circuit, and the vertical axis represents the local minimum value of the voltage of a direct-current component in the output of the mixer circuit at the time of a zero phase difference.

A characteristic curve 110 illustrated in FIG. 11 depicts the local-minimum voltage value of a direct-current component with respect to the amplitude voltage of the input oscillating signal CH. As is illustrated by the characteristic curve 110, the larger the amplitude voltage of the input oscillating signal CH, the smaller the local-minimum value of a direct-current component in the output of the mixer circuit is. Accordingly, a check as to whether the input oscillating signal CH has a desired amplitude value can be made based on the relationship between the local-minimum value of the direct-current component and the amplitude voltage of the input oscillating signal CH as illustrated in FIG. 11.

It may be noted that a mixer circuit illustrated in FIG. 2 does not function to perform an arithmetic operation equivalent to the mathematical multiplication of two input oscillating signals. Mathematically multiplying two sinusoidal signals generates a first signal having a difference frequency between the frequencies of these two signals and a second signal having a sum frequency of the frequencies of these two signals. The result of multiplication is the sum of the first signal and the second signal. The first signal may be a direct-current component, the magnitude of which is responsive to both the phase difference between the two input sinusoidal waves and the product of the respective amplitudes. Accordingly, even in the case of a mixer circuit approximating such a mathematical multiplication, the point at which the phase difference becomes zero is obtainable from the extremal value of voltage of a direct-current component. Further, when the amplitude of one of the input signals is known, the amplitude of the other one of the input signals may be estimated from the extremal value.

Figure 12:
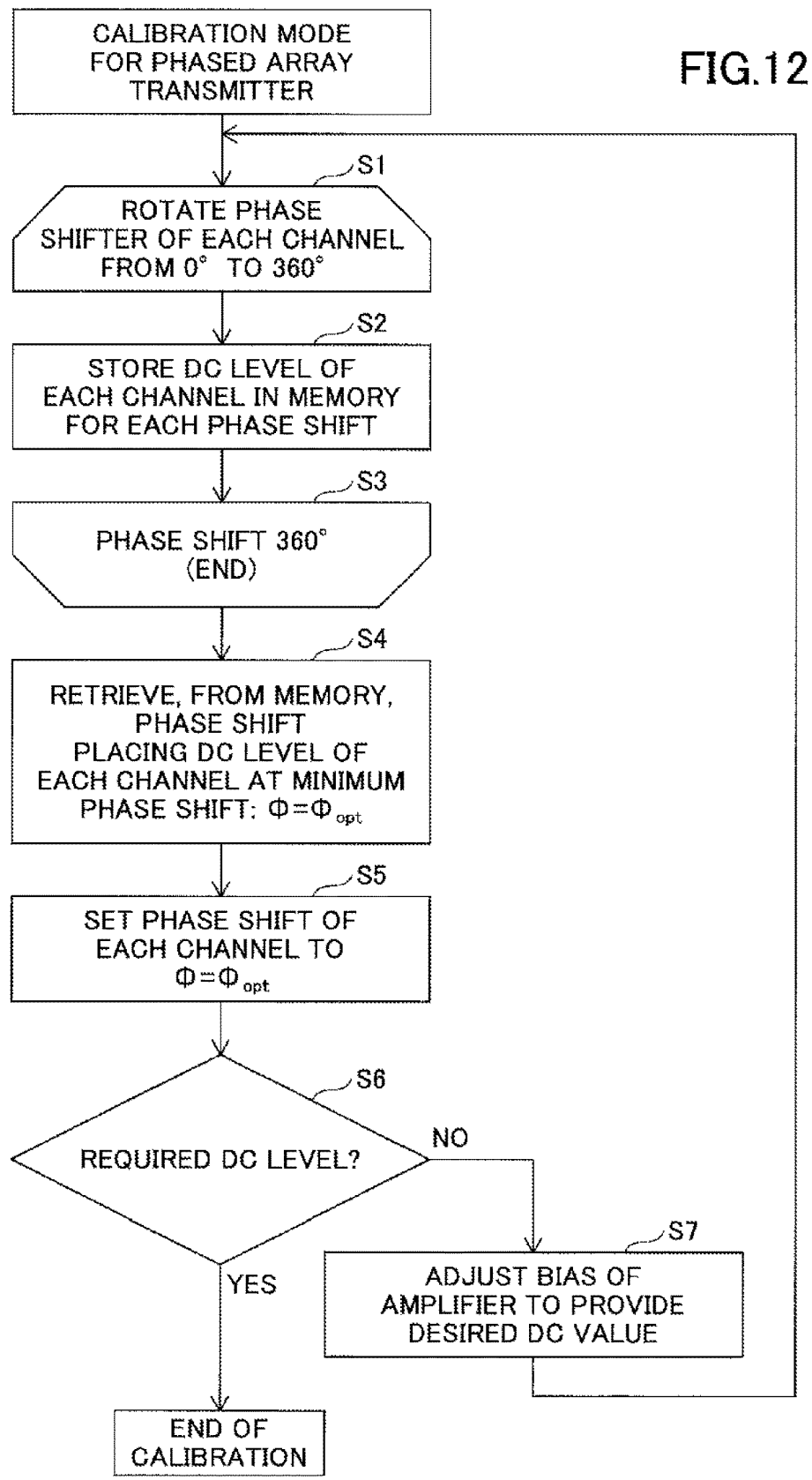
FIG. 12 is a flowchart illustrating the procedure of a zero-point correction performed in the phased array radar apparatus illustrated in FIG. 1.

FIG. 12 is a flowchart illustrating the procedure of a zero-point correction performed in the phased array radar apparatus illustrated in FIG. 1. The processes of the steps illustrated in the flowchart of FIG. 12 may be performed by the control unit 11 of the phased array radar apparatus 10 illustrated in FIG. 1.

In step S1, the control unit 11 starts a loop process in which the phase setting of the phase sifter of each transmission channel is changed from 0 degree to 360 degrees. The loop is formed by step S1 and step S3, and the process of step S2 situated therebetween is performed a number of times equal to the number of loop repetitions. The control unit 11 sets the phase value to an initial value such as 0 degree at the time of start of the loop process, and then increments the phase value by a predetermined angle each time the process returns to the head of the loop.

In step S2, the control unit 11 stores in the memory 12 data indicative of the magnitude of a direct-current component in the output of the mixer circuit of each transmission channel with respect to the phase value (i.e., phase-shift value) of the current setting. Namely, the control unit 11 receives from the signal processing circuit 33 the data indicative of the magnitude of a direct-current component obtained by removing high-frequency components from the output of each mixer circuit of the self-test circuit 14 illustrated in FIG. 2, followed by storing this data in the memory 12. In so doing, this data of each direct-current component is stored in the memory 12 in such a form that the angle corresponding to the stored data is indicated. In step S3, the control unit 11 ends the loop process if the phase value setting is 360 degrees (or another loop end value).

In step S4, the control unit 11 identifies the data making the direct-current component a minimum with respect to each transmission channel based on the data of direct-current component values stored in the memory 12, thereby obtaining a phase value $\Phi_{opt}$ corresponding to such data. In step S5, the control unit 11 sets the phase value setting of the phase shifter of each transmission channel such that the phase value setting is equal to the phase value $\Phi_{opt}$.

In step S6, the control unit 11 checks whether the magnitude of a direct-current component specified by the direct-current component data corresponding to the phase value $\Phi_{opt}$ is equal to a desired magnitude with respect to each transmission channel. As was previously described, the use of the reference oscillating signal REF having a predetermined amplitude voltage (e.g., 300 mV) causes the minimum voltage of a direct-current component to be changed as illustrated in FIG. 11 in response to changes in the amplitude voltage of the input oscillating signal CH. In order to set the amplitude of a transmission oscillating signal to 300 mV, for example, the minimum voltage of a direct-current component should be equal to approximately 100 mV according to FIG. 11. When the current direct-current component data corresponding to the current phase value $\Phi_{opt}$ with respect to a given transmission channel is smaller than 100 mV (e.g., 80 mV), it may be appropriate to decrease the amplification factor of the amplifier (i.e., one of the amplifiers 17-1 through 17-n illustrated in FIG. 1). Conversely, when the current direct-current component data is greater than 100 mV (e.g., 120 mV), it may be appropriate to increase the amplification factor of the amplifier. A proper magnitude of a change in the amplification factor required to provide a desired amplitude in the transmission oscillating signal may be determined from the data indicative of the characteristic curve 110 of FIG. 11 stored in the memory 12 in advance. Making one adjustment to the amplification factor does not have to successfully produce a desired amplitude in the transmission oscillating signal. Multiple adjustments to the amplification factor may be made such that the amplitude of an actual transmission oscillating signal gradually approaches the desired amplitude.

In step S7, the control unit 11 adjusts the amplification factor of the amplifier to provide a transmission oscillating signal of a desired amplitude with respect to each transmission channel. Namely, the amplification factors of the amplifiers are set to such values as to produce direct-current components of a desired magnitude. No change in the amplification factor may be made with respect to a transmission channel for which the transmission oscillating signal is ascertained to have a desired amplitude. Adjustments to the amplification factors may be made by adjusting the amount of bias electric currents applied to the amplifiers.

The procedure then goes back to step S1 to repeat the subsequent processes. In so doing, no further process needs to be performed with respect to the transmission channel for which an adjustment to an amplification factor has not been made in step S7. This is because a proper amplitude value is already in place for such a channel. The transmission channel for which an adjustment to an amplification factor has been made in step S7 may possibly have a phase condition thereof being changed by the adjustment to the amplification factor. For such one or more transmission channels, the processes of steps S1 through S6 will be performed again, including taking measurements for all the phase values.

In this manner, settings are made to the phase shifters 16-1 through 16-*n* and the amplifiers 17-1 through 17-*n* illustrated in FIG. 1 with respect to all the channels in a parallel manner such that the transmission oscillating signals of all these transmission channels share the same phase and the same amplitude. Namely, the zero-point correction of the phased array radar apparatus 10 is performed in a simultaneous, parallel manner with respect to all the transmission channels. This arrangement enables the realization of high-speed zero-point correction, compared with the zero-point correction performed through successive comparisons as in the related art. Further, the time required to perform a zero-point correction does not increase even when the number of transmission channels is increased.

Here, the term "simultaneous, parallel manner" means that the measurement of phases and amplitudes of a plurality of transmission channels is simultaneously performed all at once, and does not necessarily mean that the control unit 11 simultaneously makes adjustments to the settings of transmission channels. The control unit 11 may consecutively make settings to the phase values and amplitude values of the transmission channels through the operations of a single CPU or the like. Alternatively, the control unit 11 may utilize a plurality of processing units provided in parallel with respect to a plurality of transmission channels to simultaneously make settings to the phase values and amplitude values of the transmission channels.

According to at least one embodiment, a zero-point correction is made in a simultaneous, parallel manner with respect to a plurality of transmission channels.

Further, although the present invention has been described with reference to the embodiments, the present invention is not limited to these embodiments, and various variations and modifications may be made without departing from the scope as defined in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic circuit, comprising:
   a plurality of adjustment units configured to receive a same oscillating signal having a predetermined frequency and to adjust a phase and an amplitude of the oscillating signal to produce output oscillating signals;
   a plurality of coupling points configured to supply the output oscillating signals produced by the plurality of adjustment units to a plurality of antennas;
   a plurality of couplers provided in one-to-one correspondence with outputs of the plurality of adjustment units;
   a plurality of equal-length lines sharing the same length and extending from the plurality of couplers, respectively;
   a plurality of mixer circuits coupled to the plurality of equal-length lines, respectively, each of the plurality of mixer circuits being configured to receive a same reference oscillating signal having the predetermined frequency and a corresponding one of the output oscillating signals; and
   a control circuit configured to cause the plurality of adjustment units to adjust at least one of the phase and the amplitude in response to direct-current components in outputs of the plurality of mixer circuits.

2. The electronic circuit as claimed in claim 1, wherein each of the plurality of adjustment units includes a phase shifter and an amplifier, the phase shifter being configured to adjust the phase, and the amplifier being configured to adjust the amplitude.

3. The electronic circuit as claimed in claim 1, wherein any given one of the mixer circuits includes two NMOS transistors series-connected between a first voltage and a second voltage different from the first voltage, and gate nodes of the two NMOS transistors receive the reference oscillating signal and a corresponding one of the output oscillating signals, respectively, an output of the given one of the mixer circuits being a voltage at a connection point between the two NMOS transistors.

4. The electronic circuit as claimed in claim 1, wherein the control circuit is configured to cause the plurality of adjustment units to adjust the phase such that the direct-current components are placed at extremal values thereof that are extremal with respect to changes in phase settings of the plurality of adjustment units.

5. A radar apparatus, comprising:
   an oscillating circuit;
   a plurality of transmission channels configured to transmit transmission signals to antennas;
   a plurality of reception channels configured to receive reception signals from antennas; and
   a test circuit configured to perform a test with respect to the transmission channels, wherein the plurality of transmission channels include:

a plurality of adjustment units configured to receive a same oscillating signal having a predetermined frequency generated by the oscillating circuit, and configured to adjust a phase and an amplitude of the oscillating signal to produce output oscillating signals; and a plurality of coupling points configured to supply the output oscillating signals produced by the plurality of adjustment units to transmission antennas, wherein the test circuit includes:

a plurality of couplers provided in one-to-one correspondence with outputs of the plurality of adjustment units;

a plurality of equal-length lines sharing the same length and extending from the plurality of couplers, respectively;

a plurality of mixer circuits coupled to the plurality of equal-length lines, respectively, each of the plurality of mixer circuits being configured to receive a same reference oscillating signal having the predetermined frequency and a corresponding one of the output oscillating signals; and a control circuit configured to cause the plurality of adjustment units to adjust at least one of the phase and the amplitude in response to direct-current components in outputs of the plurality of mixer circuits.

6. A method of correcting transmission channels in a radar, comprising:

applying to each of a plurality of mixer circuits both a same reference oscillating signal having a predetermined frequency and a corresponding one of a plurality of oscillating signals, the plurality of oscillating signals being supplied through couplers and equal-length lines sharing the same length from a plurality of transmission channels configured to receive a same input oscillating signal having the predetermined frequency; and adjusting at least one of a phase and an amplitude of the plurality of oscillating signals propagating through the plurality of transmission channels in response to direct-current components in outputs of the plurality of mixer circuits.

* * * * *